(12) United States Patent
Fürter

(10) Patent No.: US 6,512,573 B2
(45) Date of Patent: Jan. 28, 2003

(54) PROJECTION EXPOSURE APPARATUS AND EXPOSURE METHOD

(75) Inventor: Gerd Fürter, Ellwangen (DE)

(73) Assignee: Carl-Zeiss-Stiftung, Heidenheim-Brenz (DE)

( * ) Notice: Subject to any disclaimer, the term of this patent is extended or adjusted under 35 U.S.C. 154(b) by 20 days.

(21) Appl. No.: 09/834,906

(22) Filed: Apr. 16, 2001

(65) Prior Publication Data

US 2002/0039180 A1 Apr. 4, 2002

Related U.S. Application Data

(63) Continuation of application No. 09/215,316, filed on Dec. 18, 1998.

(30) Foreign Application Priority Data

Dec. 20, 1997 (DE) .......................................... 197 57 074

(51) Int. Cl.$^7$ ..................... G03B 27/54; G03B 27/42; G03B 27/32; G03C 5/00; A61N 5/00
(52) U.S. Cl. ..................... 355/67; 355/53; 355/55; 355/70; 355/77; 430/311; 430/312; 250/492.2
(58) Field of Search .................... 355/53, 67, 55, 355/70, 77; 430/311, 312; 250/492.2

(56) References Cited

U.S. PATENT DOCUMENTS

| 4,632,522 A | 12/1986 | Ishitani | |
| 5,602,620 A | 2/1997 | Miyazaki et al. | 355/53 |
| 5,614,988 A | 3/1997 | Kato et al. | |
| 5,617,181 A | 4/1997 | Yanagihara et al. | |
| 5,617,211 A | 4/1997 | Nara et al. | 356/401 |
| 5,625,436 A | 4/1997 | Yanagihara et al. | |
| 5,657,130 A | 8/1997 | Shirasu et al. | |
| 5,688,624 A | 11/1997 | Chamberlain et al. | |
| 5,715,037 A | 2/1998 | Saiki et al. | 355/53 |
| 5,929,973 A | 7/1999 | Kakizaki et al. | 355/26 |
| 5,999,244 A | 12/1999 | Yanagihara et al. | 355/53 |
| 6,016,185 A | 1/2000 | Cullman et al. | 355/52 |
| 6,018,383 A | 1/2000 | Dunn | 355/49 |

FOREIGN PATENT DOCUMENTS

| EP | 0723173 | 7/1996 |
| EP | 0736789 | 10/1996 |
| EP | 0744665 | 11/1996 |
| JP | 7-57986 | 3/1995 |
| JP | 7-135165 | 5/1995 |
| JP | 7-218863 | 8/1995 |
| WO | WO 94/11781 | 5/1994 |

*Primary Examiner*—Russell Adams
*Assistant Examiner*—Khaled Brown
(74) *Attorney, Agent, or Firm*—Walter Ottesen

(57) ABSTRACT

The invention is directed to a projection exposure apparatus for the flat panel display manufacture having an objective array and magnifying objectives (O1 to O5).

27 Claims, 3 Drawing Sheets

PROJECTION EXPOSURE APPARATUS AND EXPOSURE METHOD

This is a continuation of application Ser. No. 09/215,316 filed Dec. 18, 1998.

FIELD OF THE INVENTION

The invention relates to a projection exposure apparatus having several parallelly arranged objectives and a scanning method for microlithographically exposing large-area structures.

BACKGROUND OF THE INVENTION

Projection exposure apparatus and scanning methods of the above kind are disclosed in Japanese patent publications JP 7-057 986, JP 7-135 165 and JP 7-218 863.

In all of these systems, an imaging scale of 1:1 is selected as, for example, in JP 7-135 165, paragraph 15, this imaging scale is provided for the condition that the mask and exposed plate can be interconnected during scanning. While this publication discloses lens systems as projection objectives, the other two Japanese publications disclose catadioptric projection objectives of the Dyson or Offner type.

Five to seven systems, which operate in parallel, are each provided with their own light sources and illuminating optics. The systems exhibit polygons as individual image fields (in two offset lines) which ensure a uniform line by line exposure during scanning.

No polygonal cropping of the optics is provided in the lens systems of Japanese patent publication JP 7-135 165. The deflecting mirrors of the catadioptric objectives are shown rectangular in the other two publications but have no reference to the trapezoidal-shaped or hexagonal image fields. In this technology having 1:1 imaging, very large format masks are required.

Systems of this kind are also known in European patent publication 0,723,173 and U.S. Pat. Nos. 5,614,988; 5,688,624; 5,617,211; and, 5,617,181.

The microlithography for semiconductor manufacture typically works with wafer steppers having objectives with demagnifying imaging of a factor of 4 or 5 with an image field of approximately 30 mm diameter with structural widths of 0.3 to 0.5 $\mu$m. Scanners increase the ratio of image field length to image field width.

For flat panel displays as in the LCD technology, large interconnected structured areas having a more than 10 inch diagonal for structure widths of typically 3 $\mu$m are required. The image fields of conventional stepper objectives are far too small. Unacceptable disturbance locations at the transitions between the exposing zones (stitching) would result in accordance with the step method and the repeat method of the wafer steppers.

European patent publication 0,744,665 discloses an arrangement for exposing a complete flat panel display (FPD) at once with a magnifying objective having a non-rotational symmetrical element.

SUMMARY OF THE INVENTION

It is an object of the invention to provide an alternative technology for the photolithographic manufacture of large-area structures. Preferably, masks should be used which correspond to those used for microchips.

The projection exposure apparatus of the invention includes: a plurality of objectives arranged in parallel with each other; and, the objectives being configured to magnify.

According to the above, it is a feature of the invention to introduce magnifying projection objectives into an objective array.

The structural widths, which are necessary for a flat panel display are relatively large compared to the state of the art for the manufacture of microchips. Accordingly, it is not difficult to provide masks having smaller structural widths than in the product. An area reduction of the mask is achieved thereby in the quadratic ratio which makes it substantially easier to manufacture and manipulate the masks.

The scanning with different speed of mask and wafer has been investigated for the manufacture of microchips with a far greater accuracy than required for flat panel displays.

The invention proceeds from the realization that:

(a) a significant simplification of the entire process is provided when the masks (reticles) are used from established technology of microchip manufacture with the conventional size and structural width; and, (b) it is known from the demagnifying scanning technology of the microchip manufacture (even for very tight tolerances) to synchronously move reticle and wafer at different speeds.

According to another feature of the invention, each objective is provided with its own object mask (reticle).

Separate reticles for each objective make possible simpler controllable small reticles which can be controllably adjusted during operation.

According to another feature of the invention, each objective is assigned its own illuminating device and each illuminating device is provided with a separate light source. The quality of the illumination and the power of the arrangement (high throughput) is optimized by the parallel arrangement of several illuminating optics and several light sources.

According to still another feature of the invention, one or several frames of each objective is cut in a polygonal form and one or more lenses of each objective is (are) configured to have a polygonal form. The image field of each objective has a polygonal form and the above adaptation of the frames and lenses of the objective to the polygonal form of the lens permits a very compact configuration of the objective array and therefore a very stable and effective strip-by-strip scan exposure. The objective can be a pure lens objective and the use thereof utilizes established optical design and permits compact packing of the individual elements of the array such as in more than two parallelly offset rows.

The objectives can have an intermediate image and permit arrangements having a one-part reticle.

The primary area of application of the apparatus and method of the invention is for the manufacture of flat panel display structures.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
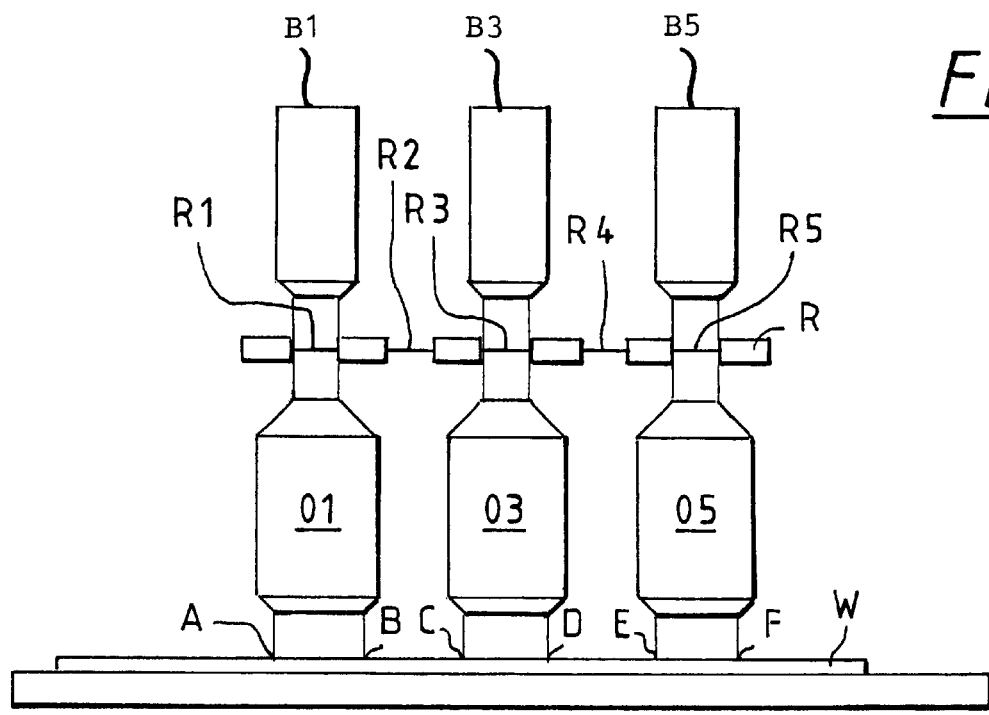
FIG. 1 is a schematic side elevation view of a projection exposure apparatus for the manufacture of a flat panel display with an array of magnifying objectives.
Figure 7:
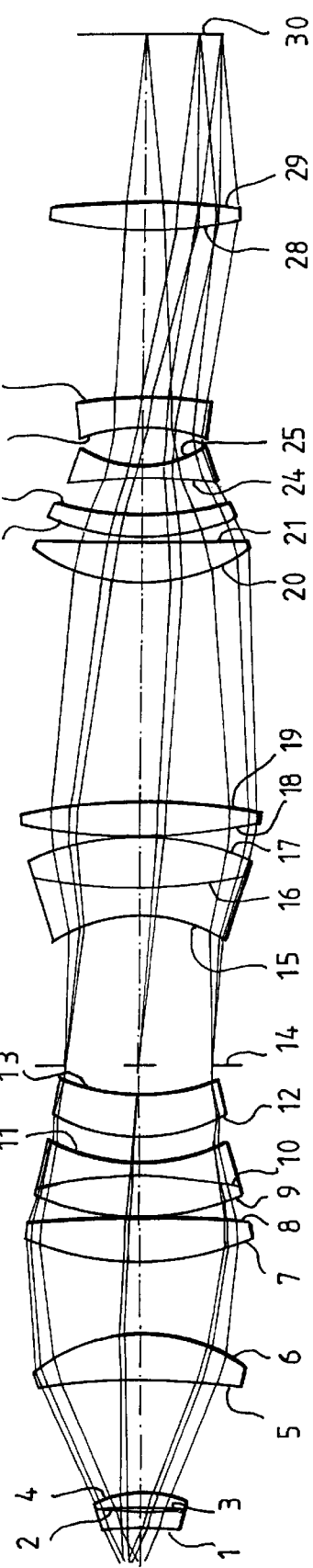
FIG. 7 is a lens section of a magnifying projection objective.

The arrangement of FIG. 1 is a line array and includes three illuminating systems (B1, B3, B5), a reticle or reticle array R, three objectives (O1, O3, O5) and the wafer W. Each of the objectives (O1, O3, O5) magnifies and effects an image reversal. These are normal refractive objectives corresponding to the configurations of microlithographic projection exposure objectives. An example is explained in greater detail with respect to FIG. 7.

A second row (with, for example, two objectives) of objectives (O2, O4) is located behind the objectives (O1, O3, O5) and reticle sections R2 and R4 are assigned to the respective objectives (O2, O4). The second row is not shown for the sake of clarity. Otherwise, the entire arrangement corresponds, like the components, substantially to the known above-mentioned array exposure apparatus.

Figure 2:
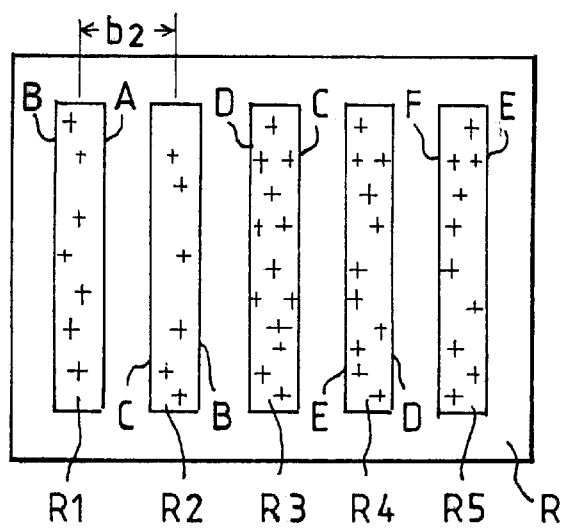
FIG. 2 is a schematic representation of a reticle or reticle array having strip masks.

The reticle array is configured in accordance with FIG. 2. The structured area of the reticle array is less than the exposed wafer area in correspondence to the imaging scale of the objectives O1 to O5. The reticle array is subdivided into strips R1 to R5 and each strip is imaged by a corresponding objective O1 to O5. As shown in FIG. 2, the strips R1 to R5 are shown separated by intermediate spaces devoid of any strip structure.

The objectives O1 to O5 effect an image reversal. For this reason, the structures on the reticle are mirrored and the image extensions are arranged as shown with the letters A, B, C, D.

Figure 3:
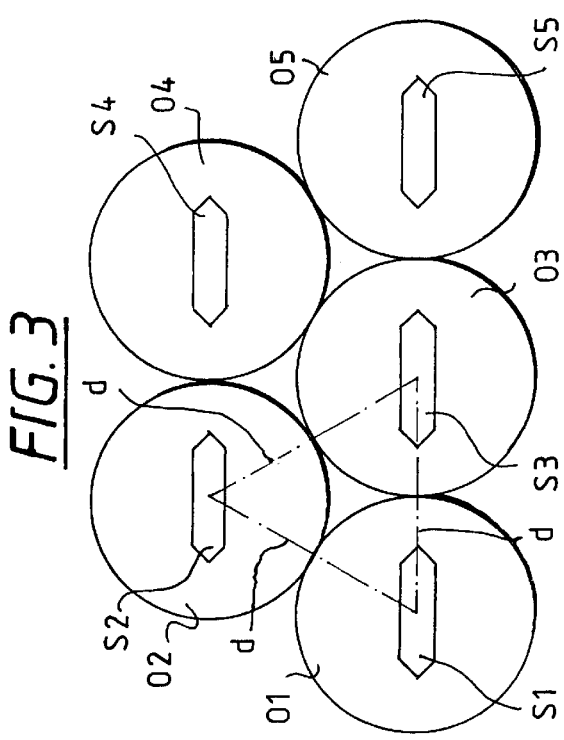
FIG. 3 is a view of the scanning slit image fields and the objectives as seen from the wafer.

FIG. 3 shows a view as seen from the wafer with the tight packaging of the objectives O1 to O5 in two rows. The packaging is determined by the diameter (d) of the objectives. The image fields of the objectives (that is, the scanning slits S1 to S5) are so dimensioned that the entire image field is exposed with a homogeneous intensity when scanning in the y direction. However, the slits S1 to S5 have a triangular shape at the ends and overlap in this region. The connection of neighboring regions is smoothed with this known measure. However, the reticle strips R1 to R5 should exhibit corresponding strips twice with identical structure at the edges.

The illustrated five-part array structure is only one example and each line can be placed in the row as desired.

The reticle R can be in one piece with all structured strips R1 to R5 or individual strips can be structured and then precisely adjusted on a carrier and then be assembled to an array. It is even possible to adapt the spacing of the individual strips (software controlled) to the requirements of the image substrate, for example, by distorting the image substrate after heat treatment. This is only possible for a reticle array but not for a large individual reticle. For this possibility, very slight magnifications of the projection objectives O1 to O5 (starting from approximately 1.1 to 1.5) are sufficient.

Figure 4:
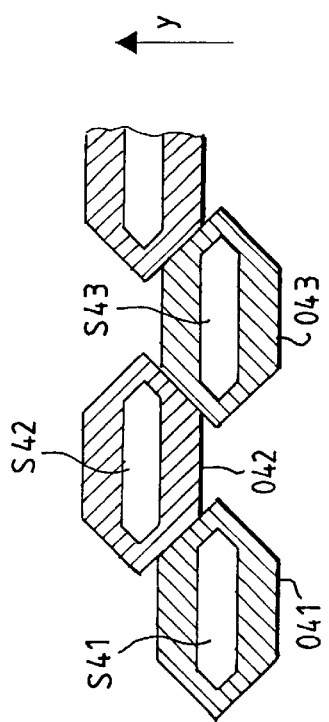
FIG. 4 is a cross section of an objective which is configured to have corners.

FIG. 4 shows how the scanning slits S41 to S44 (otherwise the same as S1 to S5) can be positioned tighter in the y direction when the objectives O41 to O44 are cropped by frames F41 to F44 and/or by lenses L41 to L44 (shown hatched) when seen in cross section. This is possible when the object-end lenses are significantly greater than the aperture-near lenses and determine the objective cross section.

The illumination devices B1 to B5 (FIG. 1) have to fit in each case into the measure of the objectives O1 to O5, O41 to O45. This, however, is not easily done because they only illuminate the smaller reticle field.

Figure 5:
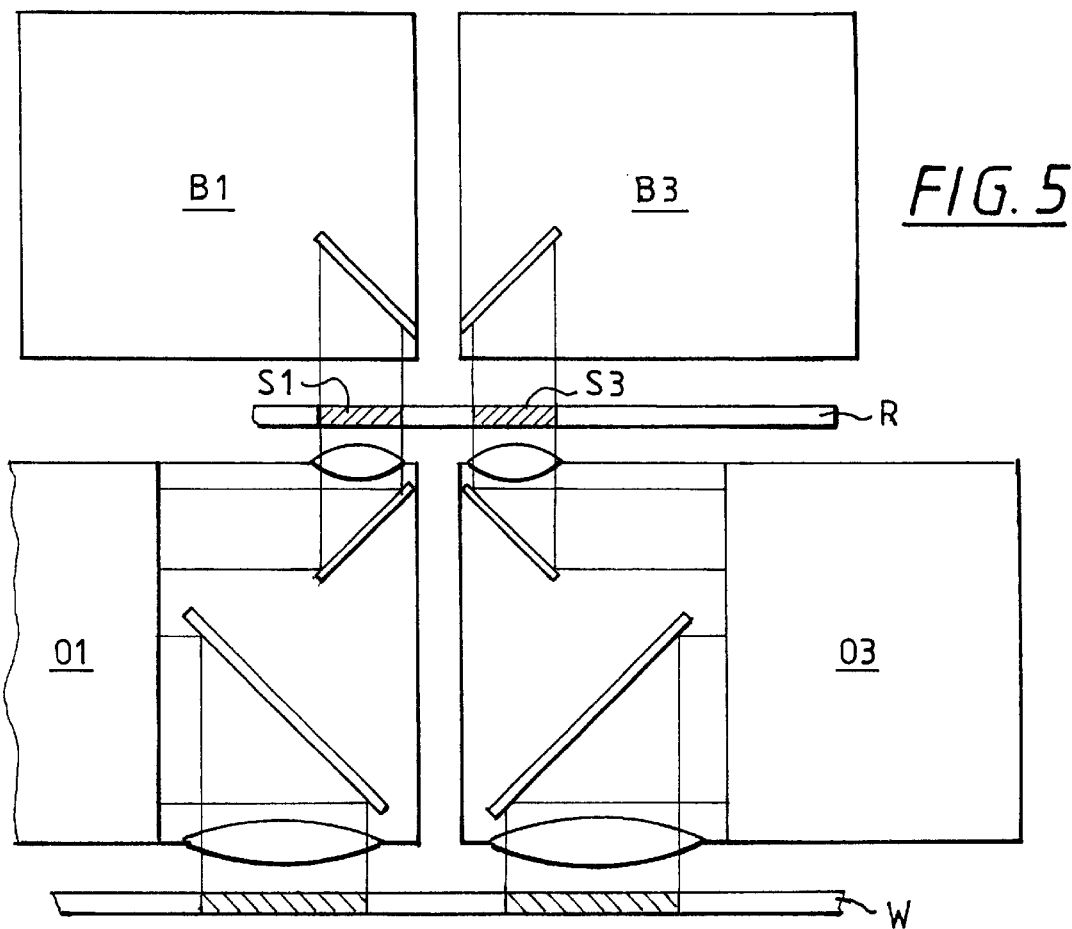
FIG. 5 is a side elevation view of a projection exposure apparatus having an array of magnifying objectives and through masks.
Figure 6:
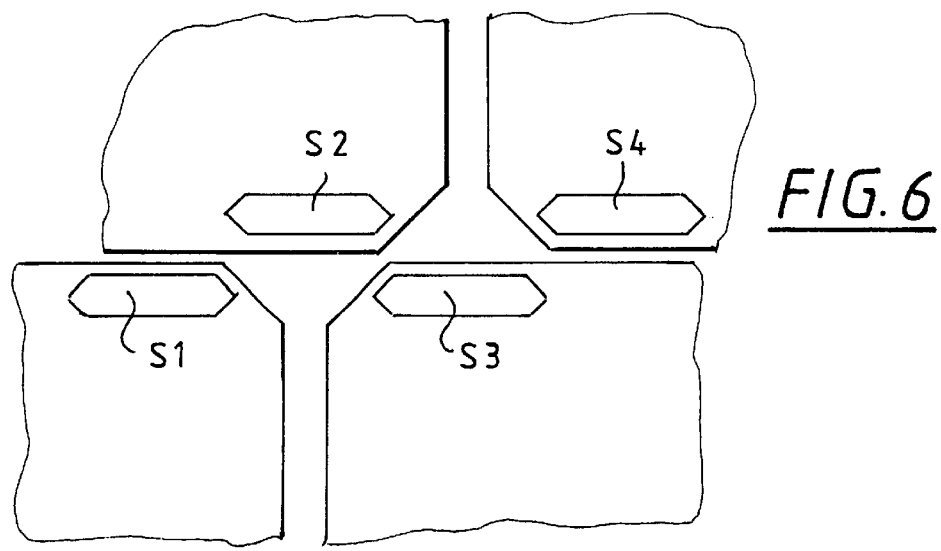
FIG. 6 is a view of the arrangement of FIG. 5 as seen from a wafer.

A variation, for which a one-part interconnected mask on the reticle R5 is sufficient, is shown in FIG. 5 in schematic side section and in FIG. 6 as seen viewed from the wafer. For this purpose, it is necessary that the reticle side field of the projection objectives O51 to O54 has the side offset compared to the image field and that an image reversal takes place. Referring to FIG. 6, the lateral offset is effected in objective O51 by mirrors M1 and M2 as shown. In objective O53, the lateral offset is effected by mirrors M3 and M4. This is also made possible by the catadioptric objectives having an intermediate image. Pure mirror objectives are also possible.

Objectives O51 to O54 of this kind can be derived from known demagnifying microlithographic projection objectives having an intermediate image wherein object plane and image plane are exchanged. An example is disclosed, for example, in European patent publication 0,736,789.

Reference is now made to FIG. 1 having refractive objectives O1 to O5. One embodiment for such an objective is presented with its design data in Table 1 and shown in the longitudinal lens section of FIG. 7.

The objective is for a mercury-discharge lamp designed for the line 436 nm and has a four-multiple magnification at an image end numerical aperture of 0.1 (object end 0.4) and a maximum image height of y'=26 mm. The structural length is 558 mm and the largest lens diameter is 82 mm. The objective has the typical configuration of refractive microlithographic projection exposure objectives, but used for magnification. The RMS image error is less than 0.032 for all image elevations and the Strehl ratio is greater than 0.96.

The types of glass listed are optical glasses and are commercially available from Schott Glas of Mainz, Germany.

It is understood that the foregoing description is that of the preferred embodiments of the invention and that various changes and modifications may be made thereto without departing from the spirit and scope of the invention as defined in the appended claims.

TABLE 1

| Surface | Radii | Thicknesses | Glasses |
| --- | --- | --- | --- |
| 0 | Object | 5.760 | |
| 1 | −163.237 | 5.958 | SF1 |
| 2 | 148.818 | 2.164 | |
| 3 | −121.380 | 4.027 | SK4 |
| 4 | −43.985 | 42.794 | |
| 5 | −201.332 | 15.134 | LAK8 |
| 6 | −62.781 | 27.567 | |
| 7 | 108.987 | 15.665 | LAK10 |
| 8 | −452.162 | 0.286 | |
| 9 | 95.420 | 13.971 | KF6 |
| 10 | −218.175 | 5.001 | SF53 |
| 11 | 66.388 | 10.333 | |
| 12 | 63.538 | 13.994 | SF2 |
| 13 | 62.997 | 10.640 | |
| 14 | ∞ (Diaphragm) | 54.848 | |
| 15 | −49.639 | 9.957 | F5 |
| 16 | 168.252 | 18.229 | SK15 |
| 17 | 91.334 | 0.254 | |
| 18 | 223.051 | 10.996 | LAKN12 |
| 19 | −269.170 | 80.447 | |
| 20 | 67.223 | 14.930 | LAKN12 |
| 21 | 874.124 | 1.009 | |
| 22 | 70.226 | 8.401 | BK7 |

TABLE 1-continued

| Surface | Radii | Thicknesses | Glasses |
|---|---|---|---|
| 23 | 106.330 | 13.736 | |
| 24 | −283.133 | 3.272 | BK7 |
| 25 | 34.468 | 15.000 | |
| 26 | −51.704 | 10.498 | LAF2 |
| 27 | −217.317 | 61.721 | |
| 28 | 141.298 | 9.427 | LAK8 |
| 29 | −333.793 | 11.981 | |
| 30 | Image | | |

What is claimed is:

1. A scanning-type projection exposure apparatus comprising:
a plurality of objectives arranged in parallel with each other;
said objectives being configured to magnify at a scale greater than 1:1.1; and,
a plurality of individual reticles assigned to said objectives, respectively.

2. The projection exposure apparatus of claim 1, said objectives each being configured to magnify at a scale greater than 1:1.5.

3. The projection exposure apparatus of claim 1, said scanning-type projection exposure apparatus being adapted to scan in a pregiven scan direction; said objectives being arranged perpendicularly to said scan direction in at least two rows with the objectives of each row being offset relative to the objectives of the next adjacent row; and, said objectives having respective individual image fields seamlessly disposed next to each other or being mutually overlapping if projected in said pregiven scan direction.

4. The projection exposure apparatus of claim 3, each of said individual image fields being so formed that each image point essentially achieves the total light dosage even in the overlap region.

5. The projection exposure apparatus of claim 3, wherein the individual image field of each of said objectives has a polygonal form.

6. The projection exposure apparatus of claim 5, wherein each of said objectives has at least one frame cut to have a polygonal shape.

7. The projection exposure apparatus of claim 5, wherein each of said objectives has at least one lens cut to have a polygonal shape.

8. The projection exposure apparatus of claim 1, further comprising a plurality of illuminating devices assigned to corresponding ones of said objectives.

9. The projection exposure apparatus of claim 8, wherein each of said illuminating devices has a separate light source.

10. The projection exposure apparatus of claim 1, wherein each of said objectives is a pure refractive objective.

11. The projection exposure apparatus of claim 1, wherein each of said objectives is an objective having an intermediate image.

12. A method for microlithographically exposing a large-area structure, the method comprising the steps of:
scanning the structure original with a plurality of objectives which effectively image a scanning line and with a plurality of reticles assigned to said objectives, respectively; and,
imaging the structure original magnified at a scale greater than 1:1.1.

13. The method of claim 12, wherein the structure original is magnified at a scale greater than 1:1.5.

14. The method of claim 12, wherein said structure is a flat image screen structure.

15. The method of claim 12, wherein said large-area structure is a substrate and said plurality of reticles are a plurality of single reticles and each of said single reticles is structured with at least one reticle strip; and, each two mutually adjacent ones of said single reticles are separated by a spacing and said spacing being adjustable; and, said method comprising the further step of:
utilizing said objectives to image corresponding ones of said reticle strips on said substrate thereby forming a desired pattern thereon.

16. A scanning-type projection exposure apparatus for generating a desired pattern on a substrate, the projection exposure apparatus comprising:
a plurality of individual objectives arranged in parallel with each other and each being configured to magnify at a scale greater than 1:1.1;
a reticle being defined by a plurality of single reticles and each of said single reticles being structured with at least one reticle strip;
said objectives functioning to image corresponding ones of said reticle strips on said substrate thereby forming said desired pattern thereon;
said objectives each being configured to effect an image reversal;
said scanning-type projection exposure apparatus being adapted to scan in a pregiven scan direction;
said objectives being arranged perpendicularly to said scan direction in at least two rows with the objectives of each row being offset relative to the objectives of the next adjacent row; and,
said objectives having respective individual image fields being so formed that each image point essentially achieves the same total light dosage.

17. The projection exposure apparatus of claim 16, wherein each of said reticle strips has an individual structure and wherein each of said individual structures is mirrored with reference to said desired pattern.

18. The projection exposure apparatus of claim 16, wherein each two mutually adjacent reticle strips have respective longitudinal edges having identical structure.

19. The projection exposure apparatus of claim 16, each two mutually adjacent ones of said single reticles being separated by a spacing and said spacing being adjustable.

20. The projection exposure apparatus of claim 16, wherein each of said objectives is a pure refractive objective.

21. The projection exposure apparatus of claim 16, wherein each of said objectives is assembled so as to be centered on a straight optical axis.

22. A projection exposure apparatus comprising:
a plurality of objectives arranged in parallel with each other;
said objectives being configured to magnify at a scale greater than 1:1.1;
each of said objectives having a reticle side field and an image field and each of said objectives incorporating a set of deflecting optics to effect a lateral offset of said image field relative to said reticle side field.

23. The projection exposure apparatus of claim 22, wherein each of said objectives is an objective having an intermediate image.

24. The projection exposure apparatus of claim 23, wherein said set of deflecting optics includes two deflecting mirrors mounted in the objective corresponding thereto.

25. A scanning-type projection apparatus for generating a desired pattern on a substrate, the projection apparatus comprising:
- a plurality of individual objectives arranged in parallel with each other and each of said individual objectives being configured to effect an image reversal;
- a reticle including a plurality of individual reticle strips defining respective individual structures;
- said reticle including several single reticles and each of said single reticles being configured to have at least one reticle strip;
- said individual objectives imaging respective ones of said individual reticle strips on said substrate forming said desired pattern;
- said scanning-type projection exposure apparatus being adapted to scan in a pregiven scan direction;
- said objectives being arranged perpendicularly to said scan direction in at least two rows with the objectives of each row being offset relative to the objectives of the next adjacent row; and,
- said objectives having respective individual image fields being so formed that each image point essentially achieves the same total light dosage.

26. The projection exposure apparatus of claim 25, wherein each of said reticle strips has an individual structure and wherein each of said individual structures is mirrored with reference to said desired pattern.

27. A projection exposure apparatus for generating a desired pattern on a substrate, the projection exposure apparatus comprising:
- a plurality of individual objectives arranged in parallel with each other and each being configured to magnify at a scale greater than 1:1.1;
- a reticle being defined by a plurality of single reticles and each of said single reticles being structured with at least one reticle strip;
- each two mutually adjacent ones of said single reticles being separated by a spacing and said spacing being adjustable; and,
- said objectives functioning to image corresponding ones of said reticle strips on said substrate thereby forming said desired pattern thereon.

* * * * *